(12) United States Patent
Joshi et al.

(10) Patent No.: US 7,701,801 B2
(45) Date of Patent: Apr. 20, 2010

(54) PROGRAMMABLE PULSEWIDTH AND DELAY GENERATING CIRCUIT FOR INTEGRATED CIRCUITS

(75) Inventors: Rajiv V. Joshi, Yorktown Heights, NY (US); Robert Maurice Houle, Williston, VT (US); Kevin A. Batson, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 342 days.

(21) Appl. No.: 11/761,655

(22) Filed: Jun. 12, 2007

(65) Prior Publication Data
US 2008/0310246 A1 Dec. 18, 2008

(51) Int. Cl.
*G11C 8/00* (2006.01)
(52) U.S. Cl. ............. 365/230.08; 365/194; 365/230.06; 365/233.11
(58) Field of Classification Search ............. 365/230.08, 365/194, 189.05, 230.06, 233.1, 233.11
See application file for complete search history.

(56) References Cited

U.S. PATENT DOCUMENTS

| 6,279,144 | B1 | 8/2001 | Henkels et al. |
| 6,549,452 | B1* | 4/2003 | Park ........................... 365/154 |
| 6,813,211 | B2* | 11/2004 | Takatsuka et al. ........... 365/222 |
| 7,006,403 | B2* | 2/2006 | Joshi et al. ............. 365/230.06 |
| 7,349,271 | B2* | 3/2008 | Kuang et al. ................. 365/201 |

OTHER PUBLICATIONS

R. V. Joshi et al., "Variability Analysis for Sub-100 nm PD/SOI CMOS SRAM Cell", ESSCIRC Proc.; Sep. 2004; 4 pages.
E. Leobandung et al., "High Performance 65 nm SOI Technology with Dual Stress Liner and low capacitance SRAM cell"; Symp. VLSI Tech; Jun. 2005; pp. 126-127.
P. Restle et al., "Timing Uncertainty Measurements on the Power5 Microprocessor", ISSCC, Feb. 2004; 8 pages.
L. Chang et al., Stable SRAM Cell Design for the 32 nm Node and Beyond; Symp. VLSI Tech, 2005; pp. 128-129.

* cited by examiner

*Primary Examiner*—Anh Phung
*Assistant Examiner*—Toan Le
(74) *Attorney, Agent, or Firm*—Tutunjian & Bitetto, P.C.; Brian Verminski, Esq.

(57) ABSTRACT

A local on-chip programmable pulsewidth and delay generating circuit includes a clock generation circuit configured to receive a global clock signal and output a local clock signal. The clock generation circuit includes a pulse shaping portion which adjusts a pulse width of the global clock signal in accordance with at least one of a trailing edge delay and a leading edge delay. The leading edge delay is generated by a leading edge delay circuit, and the trailing edge delay is generated by a trailing edge delay circuit configured to apply a delay to a trailing edge of a pulse. The trailing edge delay circuit includes a delay chain having programmable stages of delay elements, each stage being independently controlled using control bits decoded from address latches.

17 Claims, 15 Drawing Sheets

| Mode bits | 0111 | 0110 | 0101 | 0100 | 0011 | 0010 | 0001 | 0000 |
|---|---|---|---|---|---|---|---|---|
| wl PW | 70ps | 74 | 87 | 93 | 101 | 105 | 113 | 119 |

| Mode bits | 1001 | 1000 | 1011 | 1010 | 1101 | 1100 | 1111 | 1110 |
|---|---|---|---|---|---|---|---|---|
| wl PW | 133 | 138 | 147 | 152 | 160 | 166 | 294 | 300 |

| PW0 | PW1 | PW2 | Finecntl | Clkl Pulse Width |
|-----|-----|-----|----------|------------------|
| 0 | 0 | 0 | 0/1 | 100/94 ps |
| 0 | 0 | 1 | 0/1 | 86/81 ps |
| 0 | 1 | 0 | 0/1 | 73/68 ps |
| 0 | 1 | 1 | 0/1 | 56/54 ps |
| 1 | 0 | 0 | 0/1 | 113/107 ps |
| 1 | 0 | 1 | 0/1 | 126/120 ps |
| 1 | 1 | 0 | 0/1 | 139/134 ps |
| 1 | 1 | 1 | 0/1 | 256/251 ps |

(Subtract 4ps from PW when delay0 not 0)

when PW3 = 1 then no chop (wl width ≅ clkl width + 43ps)

FIG. 6

PROGRAMMABLE PULSEWIDTH AND DELAY GENERATING CIRCUIT FOR INTEGRATED CIRCUITS

BACKGROUND

1. Technical Field

The present invention relates to integrated circuits and more particularly to a programmable pulsewidth circuit and delay circuit that permits adjustment to signals in accordance with different operations on a chip.

2. Description of the Related Art

Microprocessor yields can be determined by array yield parameters such as minimum voltage (Vmin), cell stability, and array performance. Different techniques have been proposed to improve the stability of static random access memory (SRAM) cells such as dynamic or dual cell power supplies based on read or write operations, usage of multi-threshold voltage (Vt) devices, or adding transistors to a six transistor (6T) SRAM cell.

An extension of this is the usage of an eight transistor (8T) cell where read and write ports are decoupled. However, the write port of an 8T SRAM suffers the same half select problems as that of 6T cells.

In addition, with the additional device densities of new designs, it has become increasingly difficult to test integrated circuits. It has become preferable to employ built-in self testing features on chips to permit individual testing of components, to provide the ability to learn as much information as possible in case of a failure and to test proper function of components.

To this end, independent clock blocks for critical paths in a chip design and for testing are currently unavailable on-chip. Fine control of clock pulsewidth and delays is a major issue for powering and depowering VLSI control circuits. In addition, debugging of individual paths (e.g., read/write, data, reset, etc.) in VLSI circuits is also an important problem that needs to be addressed.

SUMMARY

A local on-chip programmable pulsewidth and delay generating circuit includes a clock generation circuit configured to receive a global clock signal and output a local clock signal. The clock generation circuit includes a pulse shaping portion which adjusts a pulse width of the global clock signal in accordance with at least one of a trailing edge delay and a leading edge delay. The leading edge delay is generated by a leading edge delay circuit, and the trailing edge delay is generated by a trailing edge delay circuit configured to apply a delay to a trailing edge of a pulse. The trailing edge delay circuit includes a delay chain having programmable stages of delay elements, each stage being independently controlled using control bits decoded from address latches.

A method for local on-chip programmable pulsewidth and delay generation includes outputting a local clock signal from a global clock signal by pulse shaping a pulse of the global clock signal in accordance with at least one of a trailing edge delay and a leading edge delay. Shaping the pulse includes at least one of generating the leading edge delay by providing a plurality of programmable delay settings for delaying the pulse, and generating a trailing edge delay by delaying the trailing edge using a delay chain having programmable stages of delay elements, each stage being independently controlled using control bits decoded from address latches.

A memory circuit includes a memory array including memory cells and a local wordline configured to address a row of memory cells. A driver is coupled to the local wordline and is responsive to a control signal such that the local wordline is turned on locally only for the memory cells being written to by write bitlines to reduce charge leakage due to half-selection of the memory cells.

An evaluation circuit for bitline operations includes a pair of local bitlines selectively connected to a plurality of memory cells to provide access to the plurality of memory cells. A control circuit is configured to enable an operation for outputting data from the memory cells. A PFET driver being enabled by a respective local bitline to drive a global bitline to a supply value in accordance with a low value stored in a respective memory cell.

An evaluation circuit for bitline operations includes a logic gate having inputs selectively coupled to a pair of local bitlines to compare states between the bitlines. A keeper circuit includes a plurality of transistors having gates connected to a conditional keeper control signal and an output of the logic gate such that a state of the local bitlines is evaluated by the logic gate and conditioned by the keeper circuit in accordance with feedback from the logic gate.

A global evaluation circuit for bitline operations includes a pair of global bitlines selectively connected to a plurality of local evaluation circuits to permit access to local bitlines. A control circuit is configured to control access to the global bitlines for operations between the local evaluation circuits and output latches. A predischarge circuit is responsive to a global reset signal and configured to selectively discharge the global bitlines. The global reset signal is derived from one of a wordline clock pulse and an independently controlled by a separate clock block.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein:

FIG. 3A is a diagram illustratively showing mode bits output from the latch circuit of FIG. 3 used to control and produce wordline pulsewidth adjustments in accordance with one embodiment;

FIG. 6 is a truth table implemented in FIGS. 4 and 5 in accordance with an illustrative embodiment;

DETAILED DESCRIPTION OF PREFERRED EMBODIMENTS

Figure 1:
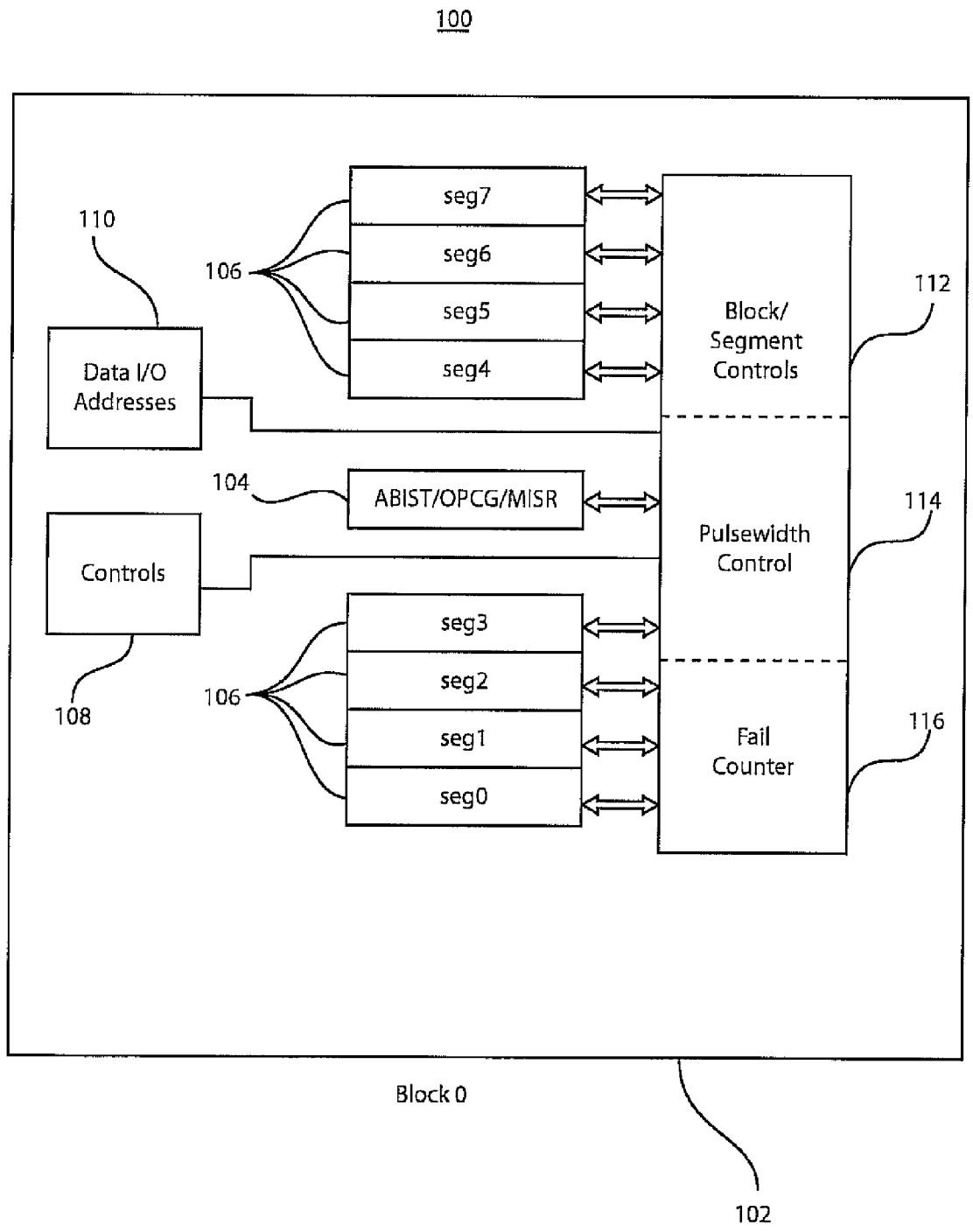
FIG. 1 is a block diagram showing an architecture of a static random access memory (SRAM) device in accordance with the present principles.

In accordance with the present principles, a clock generator circuit is provided which includes features to adjust pulsewidth and/or add delay to signals to permit the ability to perform multiple operations or to exploit a plurality of different features using the same local clock. In one embodiment, a hardware-based solution is provided to eliminate "half select" problems, improve Vmin and performance for multiport applications using SRAM arrays. The present embodiments will be illustratively described in terms of 6 transistor (6T) and 8 transistor (8T) memory cells for SRAM. However, the present principles are applicable to any memory cell technology, e.g., n-T arrays (where n goes from 1 to 20 or more).

An on-chip pulsewidth and delay adjustment circuit is described to adjust chip-internal signal parameters such as word line pulse width and calibrate the SRAM cell performance. In other embodiments, column decode logic and drivers are provided to address half-select issues. In addition, global and local evaluation circuits are described where an output is driven by a PFET to reduce output energy needed for memory cells.

Embodiments of the present invention can take the form of an entirely hardware embodiment, an entirely software embodiment or an embodiment including both hardware and software elements.

Circuits as described herein may be part of the design for an integrated circuit chip. The chip design is created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., Graphic Data System II (GDSII)) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Referring now to the drawings in which like numerals represent the same or similar elements and initially to FIG. 1, an illustrative architecture 100 is shown for an SRAM memory device to demonstrate features in accordance with the present principles to improve performance, flexibility and stability. The present embodiments will be explained in terms of an illustrative 1.2 Mbit SRAM, which uses a dual port, 8 transistor (1 Read and 1 Write port) cell. Other memory systems are also contemplated and can benefit from the present teachings. The SRAM includes a memory array which preferably utilizes unidirectional polysilicon, a dual power supply and a hierarchical read bit line. One independent read or write operation can be performed per cycle. Although details of this SRAM device are disclosed, such disclosure, should not be construed as limiting since the present principles are applicable to different sized chips, different technologies, different types of memory (e.g., dynamic random access memory (DRAM), etc.) having different types of memory cells, etc. An example of an SRAM reduced to practice by the present inventors is provided in the following example(s).

One of four banks 102 used in a macro is shown in FIG. 1. Each of the 4 blocks or banks 102 includes an Array Built-In Self Test/On Processor (or Product) Clock Generator (ABIST/OPCG) circuit 104 and 8 segments 106, where each segment is 512 rows by 72 columns.

Column decoding multiplexes the 72 columns down to 9 bits per segment 106. Each block 102 is independent and has an address space of 32 k 9-bit entries. Circuit controls 108 and address input/output 110 provide peripheral logic for controlling the segments 106 through block/segment controls 112. Only 1 segment per block is active at a time. A pulsewidth control circuit 114 will be described in accordance with one aspect of the present invention to control pulsewidths of wordline pulses, clock pulses, stress signals, etc. in accordance with aspects of the present principles.

For high speed testing, the programmable ABIST engine 104 can provide stimuli to fully exercise the peripheral logic (108) and array (segments 106) at frequencies from, e.g., 1 GHz to 8 GHz using a programmed OPCG-generated internal clock. Within each segment 106, local clock blocks (LCB) (not shown) generate clocks for launching word and bit addresses. These clock blocks have several width and delay settings to produce word line pulse widths that range from, e.g., 55 ps to 300 ps at nominal voltages. To help characterize SRAM performance and margins, word line pulse widths can be varied selectively using control circuit 114 by a type of array operation. This helps determine whether problems are read or write related. The word line pulse width controls 114 are also used to determine the stress equivalent frequency of the memory cells by systematically reducing the word line pulse width until the array starts to fail. These fails can be logged in with a fail counter 116. Roughly two times the wordline pulse width is used as a rule of thumb to determine the stress equivalent frequency of the array.

Figure 2:
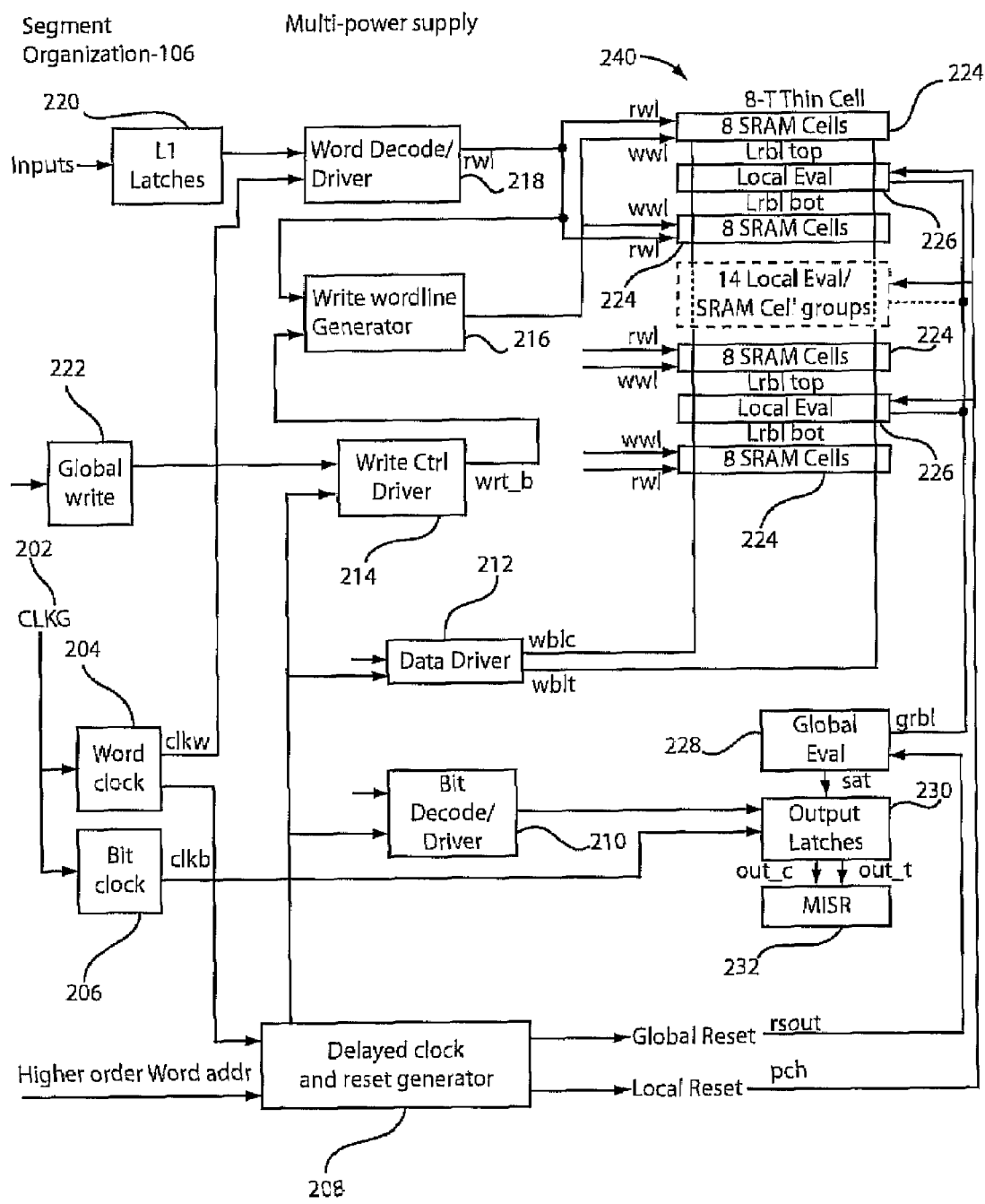
FIG. 2 is a schematic diagram showing a segment of the architecture of FIG. 1 in greater detail.

Referring to FIG. 2, a schematic diagram illustratively shows the organization of a segment (106) of an SRAM with word, bit and write paths. In the present structure (8T), wordlines are separate for read and write operations. In a 6T design, the same wordlines are employed for both read and write operations. The array 240 includes SRAM cells 224 (8 SRAM cell groups). The array includes local evaluation circuits 226 and a global evaluation circuit 228. Input data is provided to level 1 (L1) latches 220 and written to the array 240 using a word decode/driver circuit 218 and a write wordline generator 216. Circuit 218 provides a read wordline signal rwl while circuit 216 provides a write wordline (wwl) signal. The word decode/driver 218 is synchronized using a word clock 204 (clkw). Write wordline generator 216 employs a global write clock 222 through a write control driver 214 which outputs wrt_b. The word clock is also input to a delayed clock and reset generator 208 which employs higher order word addresses to provide global reset and local reset signals, respectively, to the global evaluation circuit 230 and the local evaluation circuit 226.

The delayed clock and reset generator 208 provides a clock signal to the write control driver 214, to a data driver 212 and to a bit decode/driver 210. The bit decode/driver 210 and the bit clock 206 are employed for synchronizing the output latches 230 to provide output complement and true signals (out_c and out_t) to a Multiple-Input Shift Register (MISR) 232. The data driver 212 drives bit lines with signals write bit line complement (wblc) and write bit line true (wblt).

Bitlines are read locally and globally using the local evaluation circuit 226 and global evaluation circuit 228, respectively. Local read bitlines (Lrbl) report to local evaluation circuits 226 and global read bitlines (grbl) report to global evaluation circuit 230.

In addition to Multiple Input Shift Registers (MISRs) 232 which capture only pass/fail results during ABIST testing, 16-bit fail counters 116 (FIG. 1) are incorporated into the logic for each segment 106. Fail count information is very useful in the SRAM design process to know whether or not the failing mechanism is catastrophic or single-cell in nature. It is also useful in the understanding of the statistical range of operation of the SRAM design at each voltage-frequency schmoo point. The nine segment outputs are sent to the fail counters 116 where they are compared to the ABIST-generated expect data and the results of each compare are latched. The latched compare results are combined (OR-ed together) to form the trigger for the counter circuit 116. The fail counter 116 counts the number of ABIST cycles that failed and then returns this count at the end of a test.

Figure 3:
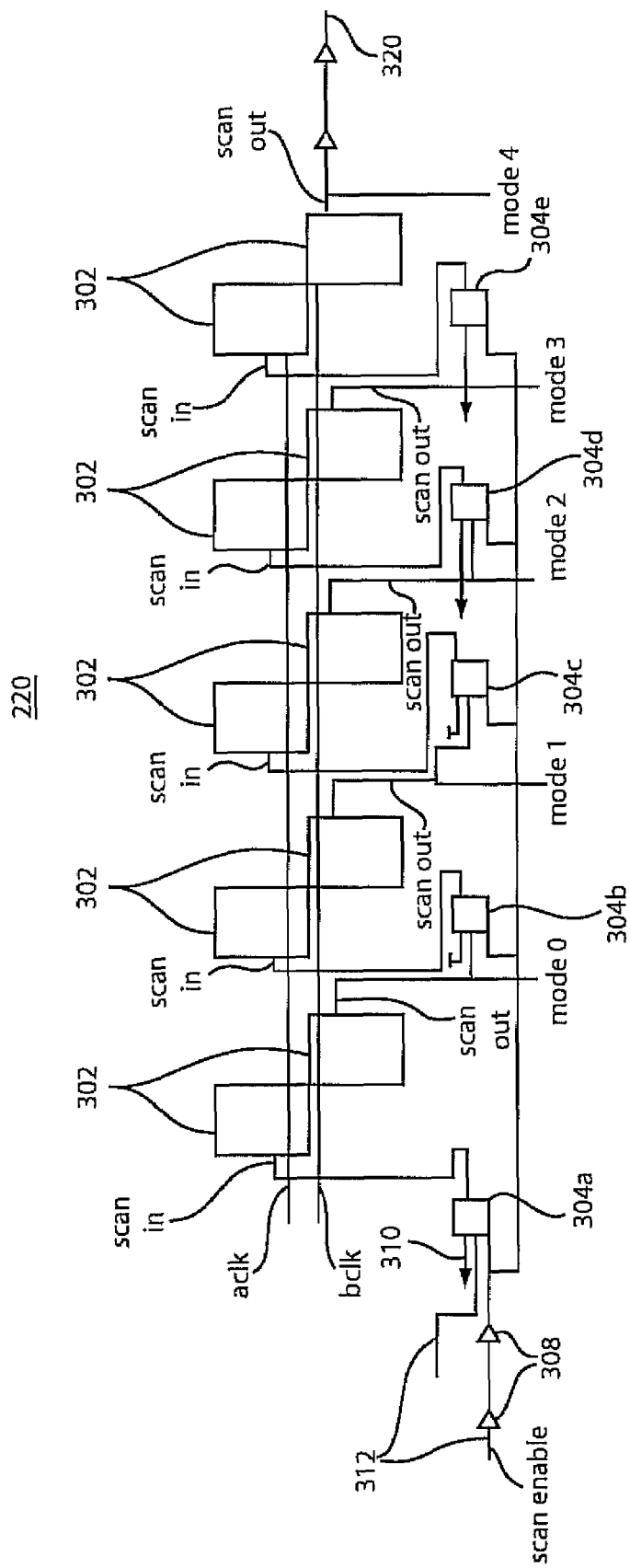
FIG. 3 is a schematic diagram of a latch circuit for outputting control bits for controlling a local clock generation circuit in accordance with one embodiment.

Referring to FIG. 3, a latch circuit 220 is illustratively depicted. Latch circuit 220 includes scan enable signal inputs 312. Delay elements 308 appropriately delay one of the inputs 312 to a gate 304a. Gate 304a receives data from an input 310. Gate 304a may include an AND gate, for example. Other gates 304b-304e are similarly enabled and configured to receive scanned in data (scan in) to produce signals, mode 0, mode 1, mode 2, mode 3 and mode 4. Scanned in data is input to a plurality of latches 302 which depending on the input information (e.g., wordline addresses) output mode signals (mode 0, mode 1, mode 2, mode 3 and mode 4). The latches 302 further provide a scan out output 320 which is employed by the word decoder/driver 218 (FIG. 2).

Mode 0, mode 1, mode 2, mode 3 and mode 4 are employed as a control words (or words) employed in adjusting delay and pulsewidth of signals as will be described in greater detail below. FIG. 3A shows an illustrative diagram showing control words (mode bits) for 16 different wordline pulsewidths (wl PW) where 0000 is the default condition.

Figure 4:
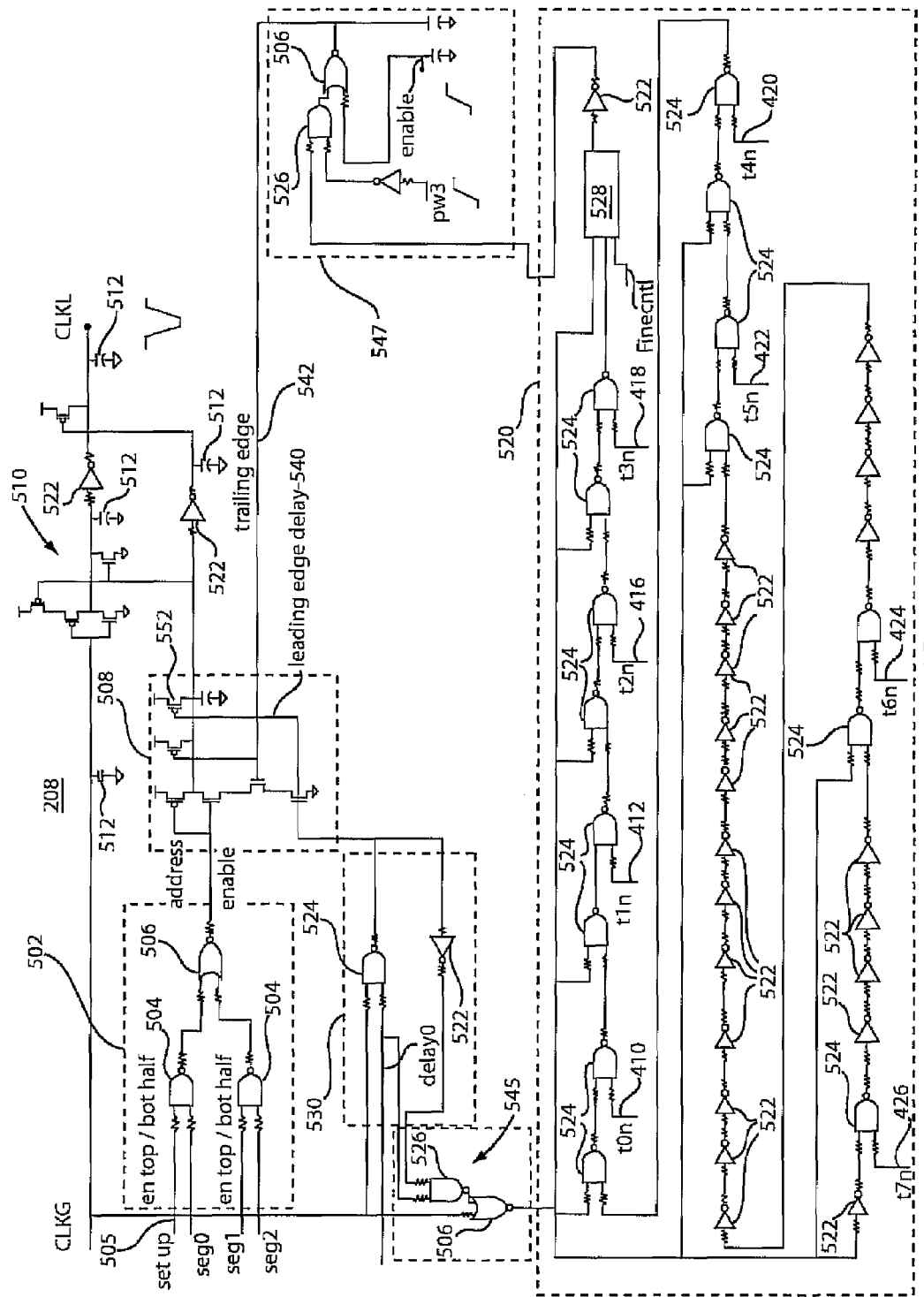
FIG. 4 is a schematic diagram showing a pulsewidth and delay generating circuit in accordance with an illustrative embodiment.

Referring to FIG. 4, a local clock generator 208 is shown in accordance with an illustrative embodiment. Generator 208 includes a programmable delay circuit 520 configured to adjust delay and pulsewidths of input signals, e.g., clock signals, wordline pulses, etc. In the embodiment depicted, a global clock CLKG is adjusted to output a local clock CLKL. The delay circuit 520 includes logic in the form of delay elements 522 and gates 524. The gates 524 preferably include NAND gates configured to turn on and off one or more delay elements 522, which preferably include inverters. Other elements employed include transistors 552 and capacitors 512. One skilled in the art would understand that different polarities, configurations and components types may be selected and employed in accordance with the present principles.

To reduce the delays of the delay or pulsewidth elements 522, a power supply of the delay or pulse width element 522 can be connected to a "VCS" supply. VCS is greater than Vdd, and VCS is usually the power supply voltage for memory cells of a memory chip.

Figure 5:
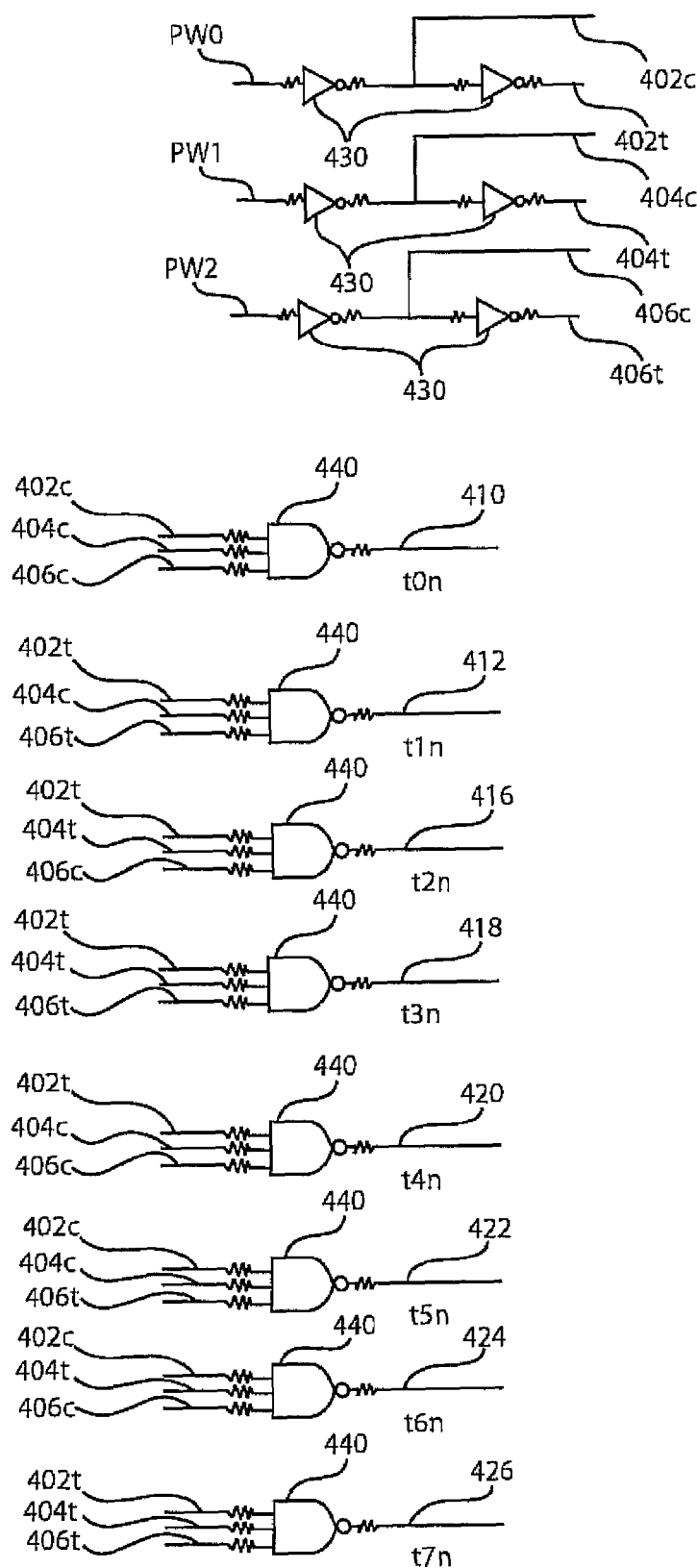
FIG. 5 is a schematic diagram showing decoding of control signals for controlling the pulsewidth and delay generating circuit output in accordance with an illustrative embodiment.

Gates 524 represent programmable levels of delay that may be added to a signal to adjust its pulsewidth or delay. The simple structure of gates 524 is employed to steer the desired delay setting to the clock output (CLKL). Advantageously, small loads are placed on all delay stages except for the initial driver. In the circuit 208, multiple modes can be obtained, for example, 2 delay settings (2 bits of delay0), sixteen pulsewidth settings and a no-chop feature. It should be understood that a greater (or less) number of pulse width settings or delay settings is also contemplated. The multiple pulsewidth and delay settings are advantageously provided through fewer signals decoded to create multiple control settings. Each bit or combination of bits provides a different control feature (FIG. 5). The pulsewidth may be tailored for low to high power operation.

Controllable settings may be set through a general purpose register chain (latches) and programmed based on an operation being performed. For example, in one embodiment, multiple settings for pulsewidth may be employed to "stress an SRAM cell" independently of external clock speeds. For example, a new internal clock signal may be generated and incrementally adjusted. In another embodiment, delayed settings can be used to control internal timing of circuit components on the chip. In yet another embodiment, multiple clock blocks can be used independently for debugging multiple internal timing and improving performance.

Programmable pulsewidths can be used to improve read/write margins. Circuit 208 may be employed for individual clock blocks for read/write, wordline generation, global reset generation, bit clock generation, etc. Similar clock blocks may be employed for different memory or processor devices e.g., register files, DRAM, processor applications, etc.

A control word is supplied using the mode 0, mode 1, mode 2, mode 3 and mode 4 signals output from latches in latch circuit 220 (FIG. 3). Mode 0, mode 1, mode 2, mode 3 and mode 4 respectively correspond to signals PW0, PW1, PW2, PW3 and finecontrol (finecnt1) (or delay0 etc.).

Addressing circuit 502 is employed to locate a wordline to be pulsed. A setup signal 505, seg0, seg1 and seg2 are employed in this illustrative embodiment to enable a top or bottom half wordline for the respective segment in the memory array. These signals gate the clock signal and allow the clock under the appropriate conditions. A NOR gate 506 of circuit 502 outputs address information to a pulse adjustment circuit 508. Pulse adjustment circuit 508 provides a leading edge delay line 540 and a trailing edge delay line 542.

The leading edge delay may be adjusted by employing a leading edge adjustment circuit 530. A control signal for circuit 530 includes a delay0 input to provide clock delay, e.g., between 3-5 ps. When delay0 is not equal to zero a portion of the delay may be subtracted using a delay element 522 or elements of circuit 530. In one illustrative embodiment, 4 ps is subtracted from the pulse width of CLKG. This is input to the programmable delay circuit 520 using logic 545. Delay0 may be an external signal reset by a latch, for example.

Circuit 530 outputs a leading edge delay signal to a pulse adjustment circuit 508, which generates a wordline pulse and adjusts the pulse in accordance with the leading edge delay from circuit 530 or trailing edge delay which is provided by feedback from the programmable delay circuit 520.

A trailing edge delay is programmable using signals t0n, t1n, t2n, t3n, t4n, t5n, t6n, t7n and finecnt1. Signals t0n, t1n, t2n, t3n, t4n, t5n, t6n, t7n are generated from PW0, PW1, PW2 in FIG. 5.

Referring to FIG. 5, with continued reference to FIG. 4, PW0, PW1 and PW2 are split into true and complement signals: 402c,t, 404c,t, 406c,t by employing inverters 430. The true and complement signals 402c,t, 404c,t, 406c,t are decoded using gates 440 (e.g., NAND gates) to generate the signals t0n, t1n, t2n, t3n, t4n, t5n, t6n, t7n employed to program the delay circuit 520. The fine control signal (finecnt1) may be derived in a similar way or based upon a predetermined setting for a particular application or chip design. The finecnt1 signal may be an external and latched signal. The finecnt1 signal may be employed to control a fine delay gate or delay element 528 to provide an additional level of precision in the delay/pulse width amount. Delay element or block 528 may employ device sizes, e.g., gated fingers, to produce a finer scale of delays. It should be understood that the logic and signal selection may be altered or modified by one skilled in the art without departing from the teachings of the present principles.

PW3 is employed as a "no chop" option. For example, if PW3 is high the delay introduced in the delay path is bypassed by a no chop circuit 547. In this way, the basic or standard pulse width of the applied clock is employed without being "chopped" or shortened. The no chop option permits a return to the standard wordline pulse width at anytime during operations. The enable signal for circuit 547 permits enablement of the delay circuit as an input to adjust the trailing edge and therefore control the pulse width of the wordline pulse.

Referring to FIG. 6, a truth table 600 illustratively shows control signaling for adjusting pulse width for CLKL in accordance with the circuits of FIGS. 4 and 5. PW0, PW1 and PW2 provide a plurality of different pulse width combinations for CLKL. The pulse width is fine tuned using finecnt1 to further tweak the pulse width. A pulse width of a wordline in one embodiment is the CLKL width plus 30-40 ps. The 30-40 ps gets added due to the downstream logic such as predecode and decode logic. Also "RC" delays add to the wiring. The predetermined value (e.g., 30-50 ps) provides set up time (e.g., for switching, etc.) to ensure that the pulse transition is seen to prevent signal loss due to premature transitions of the signal.

Figure 7:
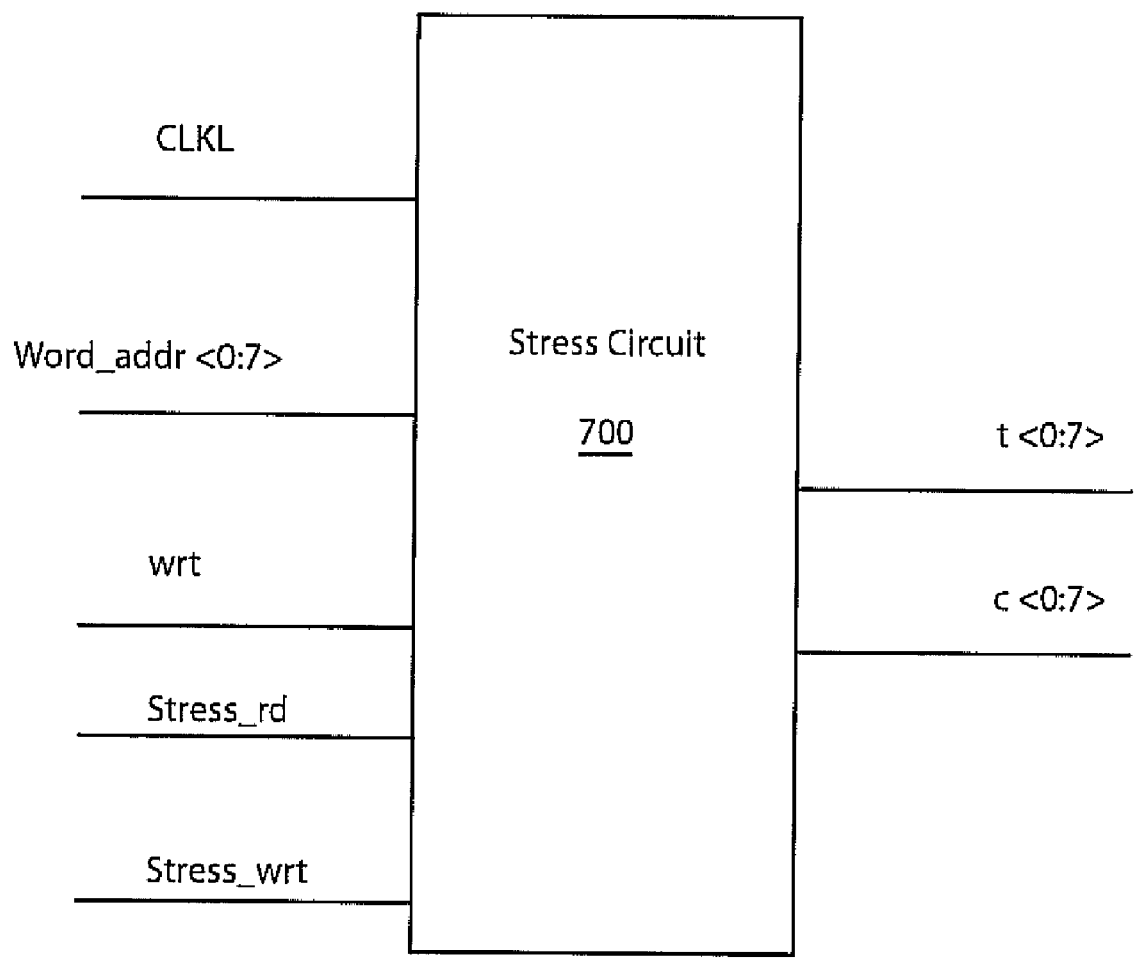
FIG. 7 is a diagram showing a stress circuit employed for providing pulse width adjustment controls in accordance a memory cell stress operation.

Referring to FIG. 7, a stress circuit 700 is configured to function as an on-chip control circuit (e.g., circuit 114 of FIG. 1). Stress circuit 700 stresses, in a write or read operation, specific wordlines until a failure is encountered. This helps determine whether problems are read or write related. The wordline pulse width controls 114 (FIG. 1) are used to determine the stress equivalent frequency of the memory cells by systematically reducing the wordline pulse width until the array starts to fail. Stress circuit 700 is enabled for testing and the mode of testing using stress_rd and stress_wrt signals. In a memory architecture where read wordlines and write wordlines are separate, a stress read operation (wrt=0) tests an addressed read wordline (e.g., word address <0:7>) using output true (t<0:7>) and complement (c<0:7>) signals, and a stress write operation (wrt=1) tests an addressed write wordline (e.g., word address <0:7>) using output true (t<0:7>) and complement (c<0:7>) signals. Circuit 700 may be adapted for wordlines that perform both read and write operations (e.g., in 6T SRAM cells).

A local clock (CLKL) is employed for clocking the operations. CLKL may be generated by an appropriately adapted circuit 280 of FIG. 5 to provide a desired clock signal. In addition, the stress_rd and stress_wrt signals can be controlled to systematically reduce the pulse width of the wordline signals to determine a failure frequency/pulse width. In one embodiment, the clock generator circuit 208 of FIG. 5 is adapted to provide a desired pulse width for wordlines.

Stress_rd and stress_wrt signals are employed to control the pulses during read and write operations respectively. When stress_rd is "high" and stress_wrt is "low", the CLKL pulse is allowed to pass through two NAND gates. Then, the CLKL pulse may be delayed by inverters and a "NOR" operation performed with respect to the original CLKL pulse. These operations may be employed to chop or reduce the pulse further during the read operation (or the write operation or both). The stress_rd and stress_wrt signals can be programmed to provide the following functions in accordance with the truth table of TABLE 1:

TABLE 1

| stress_wrt | stress_rd | |
|---|---|---|
| 0 | 0 | wordline pulse width not reduced |
| 0 | 1 | read wordline pulse width reduced |
| 1 | 0 | write wordline pulse width reduced |
| 1 | 1 | read and write wordlines have pulse width reduced |

The step-size of the reduction can be determined in advance depending on the number of pulse width control settings that are available to systematically reduce the pulse width of the wordline signals to determine a failure frequency/pulse width.

Figure 8:
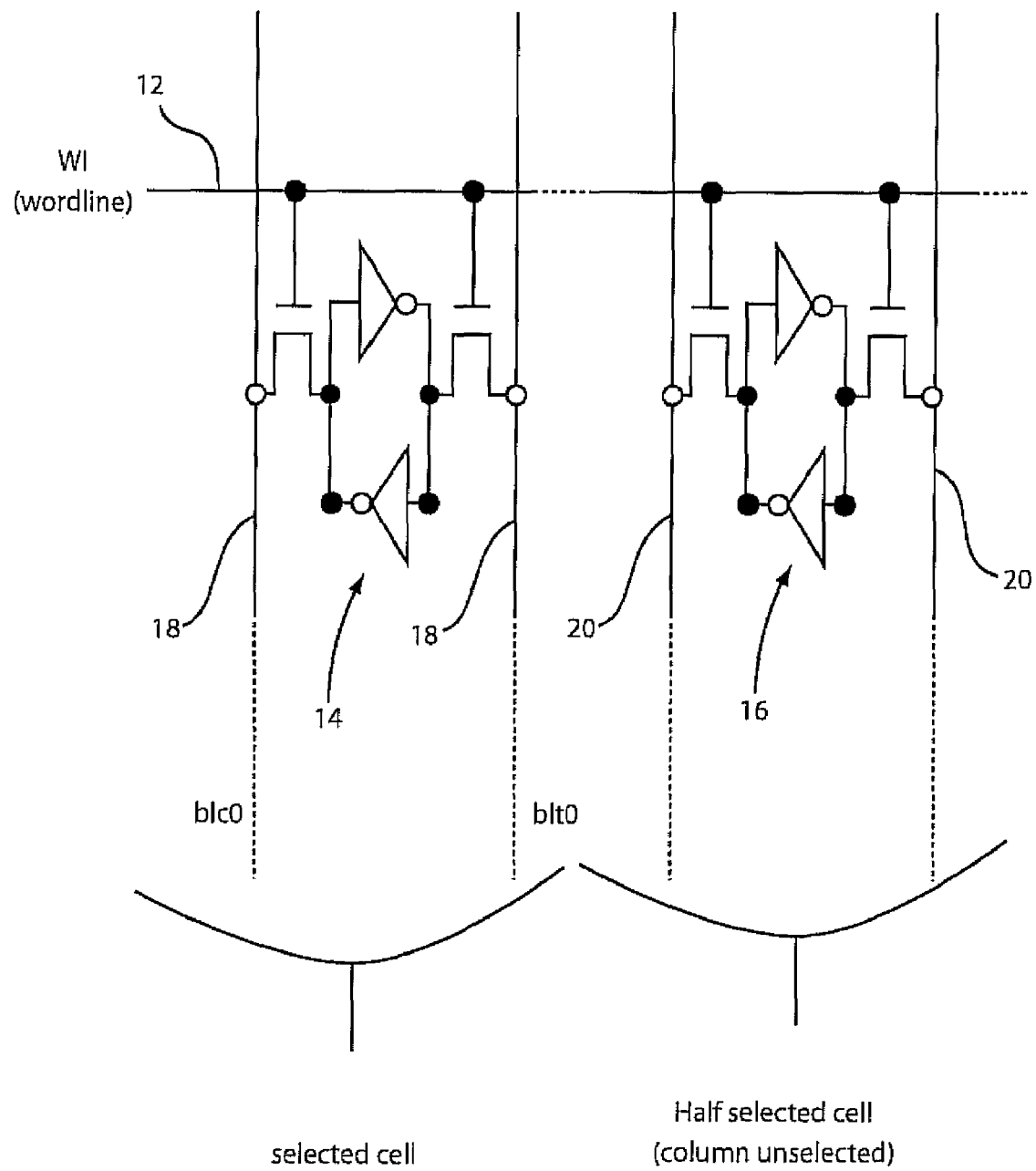
FIG. 8 is a prior art schematic diagram showing a selected column of cells and an unselected column of cells which is half selected due to the sharing of a wordline.

Referring to FIG. 8, prior art 6T SRAM cells 14 and 16 are illustratively shown. Cell 16 may suffer from a half select failure. Half select occurs when a wordline 12 is on while a column select is off. This leads to poor stability even when using fewer cells on a bitline 18 and 20. Due to the combination of active signals, the data in the cell may be partially or fully written to or discharged since the cell is half-selected. In accordance with an illustrative embodiment, half-select problems are reduced or eliminated.

Figure 9:
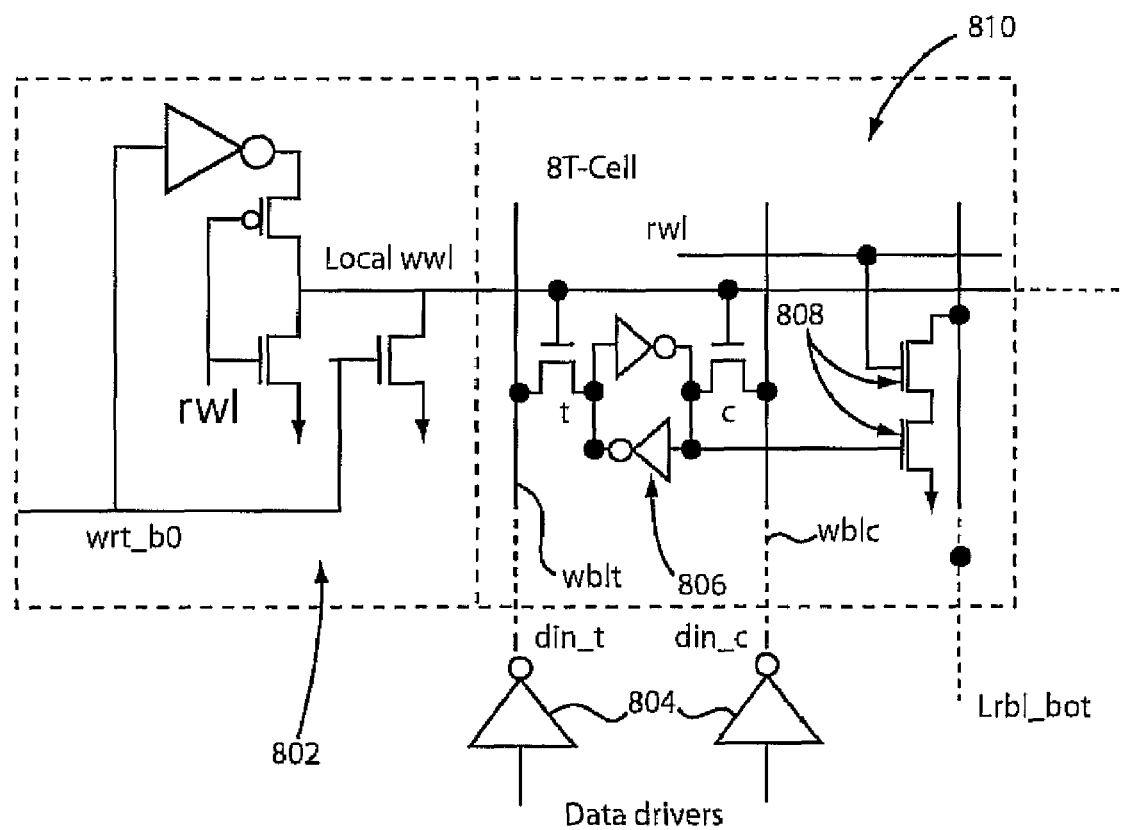
FIG. 9 is a schematic diagram showing a local wordline controlled by a logic word to such that the wordline is activated locally to avoid half selection of other cells.

Referring to FIG. 9, a three transistor (3T) driver 802 and a 8T cell 810 are illustratively depicted. Driver 802 may be shared by 8 cells in a row. A write byte (gated write signal (wrt_b) from write control driver 214 (FIG. 2)) is employed to activate a wordline locally on a row of cells in accordance with a column of rows to be selected for an operation. Data drivers 804 provide data signals (din_c and din_t) on write bitlines (wblt and wblc). When wrt_b0=0 (where wrt_b0 is illustrative of wrt_b for segment 0), local write word lines (local wwl) are generated or activated (Local wwl=1). When the write control (wrt_b0=1) the Local wwl is turned off to avoid half-select disturb conditions. In other words, the write local wordline, wwl, is activated only to selected cells to be written, all other cells that are not to be written will not have write local wordline, wwl, activated. This avoids the half-select condition in non-selected cells. The write byte wrt_b0 eliminates half-select issues during write operations.

A separate read port rwl eliminates half-select during read operations. In addition to a 6T portion 806, the 8T cell includes a circuit 808 which enables a separate read wordline (rwl). A local read bitline bottom (Lrbl_bot) in this case, is employed for reading data into the cell 810. Internal cell noise (noise on internal nodes) for a cell in accordance with the present principles is significantly lower than the half-select failure threshold level of conventional schemes.

Figure 10:
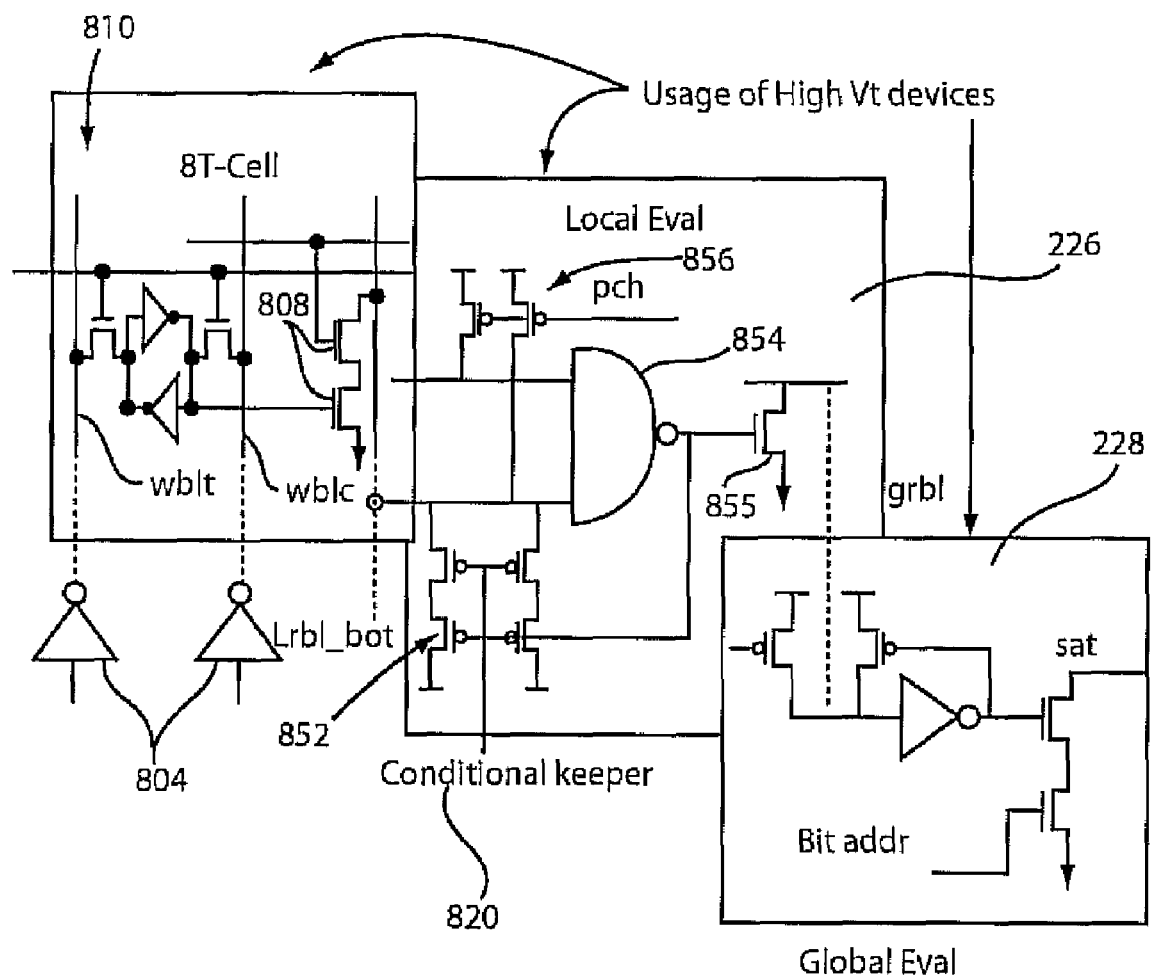
FIG. 10 is schematic diagram showing a memory cell, local evaluation circuit and a global evaluation circuit in accordance with an illustrative embodiment.
Figure 11:
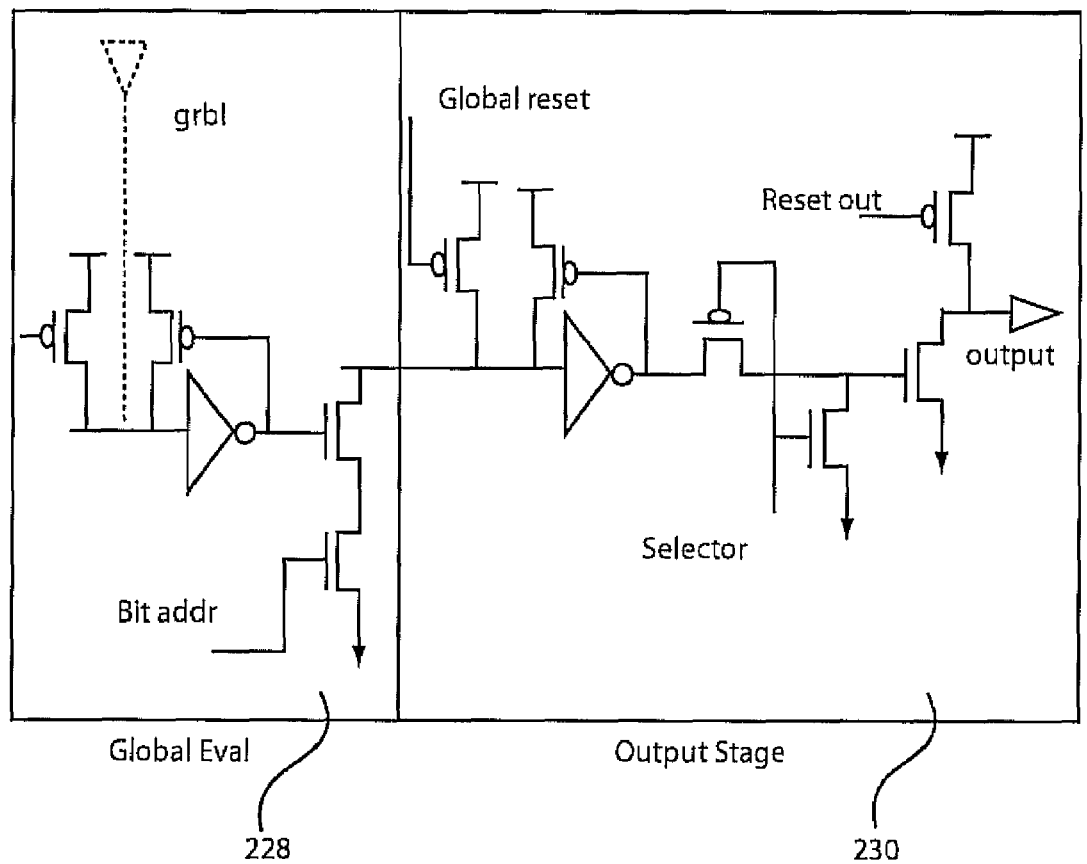
FIG. 11 is a schematic diagram showing the global evaluation circuit of FIG. 10 and an output stage in accordance with an illustrative embodiment.

Referring to FIGS. 10 and 11, a hierarchical data path within each segment 106 (FIG. 1) is illustratively shown. In each segment 106, 512 rows are divided into an upper half and lower half including 256 cells per column. A read bit line is single-ended and hierarchical: there are 8 cells per local read bit line (Lrbl) and one local evaluation circuit 226 that connects two local read bit lines (Lrbl) to a global read bit line (grbl). There are 16 local evaluation circuits 226 per global read bit line (grbl).

Write bit lines (wblc and wblt) are dual-ended and are not hierarchical. Read before write issues are prevented by decoupling the read and write ports as described. The top and bottom global read bit lines (grbl) are dotted together to form a first multiplexer operation of a 1 of 8 bit column select. A conditional keeper control 820 is a programmable signal with 3 choices: delayed-on, always on, always off. The 36 outputs produced are further multiplexed down to 9 read data outputs (FIG. 11). The conditional keeper 820 employs transistors 852 and a NAND gate 854 to enable the global read bitline (grbl) in accordance with the local read bitline (Local rbl). Evaluation circuit 226 further includes a reset circuit 856 which employs a local reset clock (pch) to reset the NAND gate 854. The local evaluation circuit 226 is precharged (pch) using a precharge circuit (PFETS) 85, which precharges the input nodes of the NAND gate 856 during a precharge period. When the precharge clock is removed, the possibility of the local bitlines floating becomes more likely. The condition of the local bitlines is provided by a keeper circuit 852 which is enabled by a conditional keeper signal or feedback from NAND gate 854.

Figure 10A:
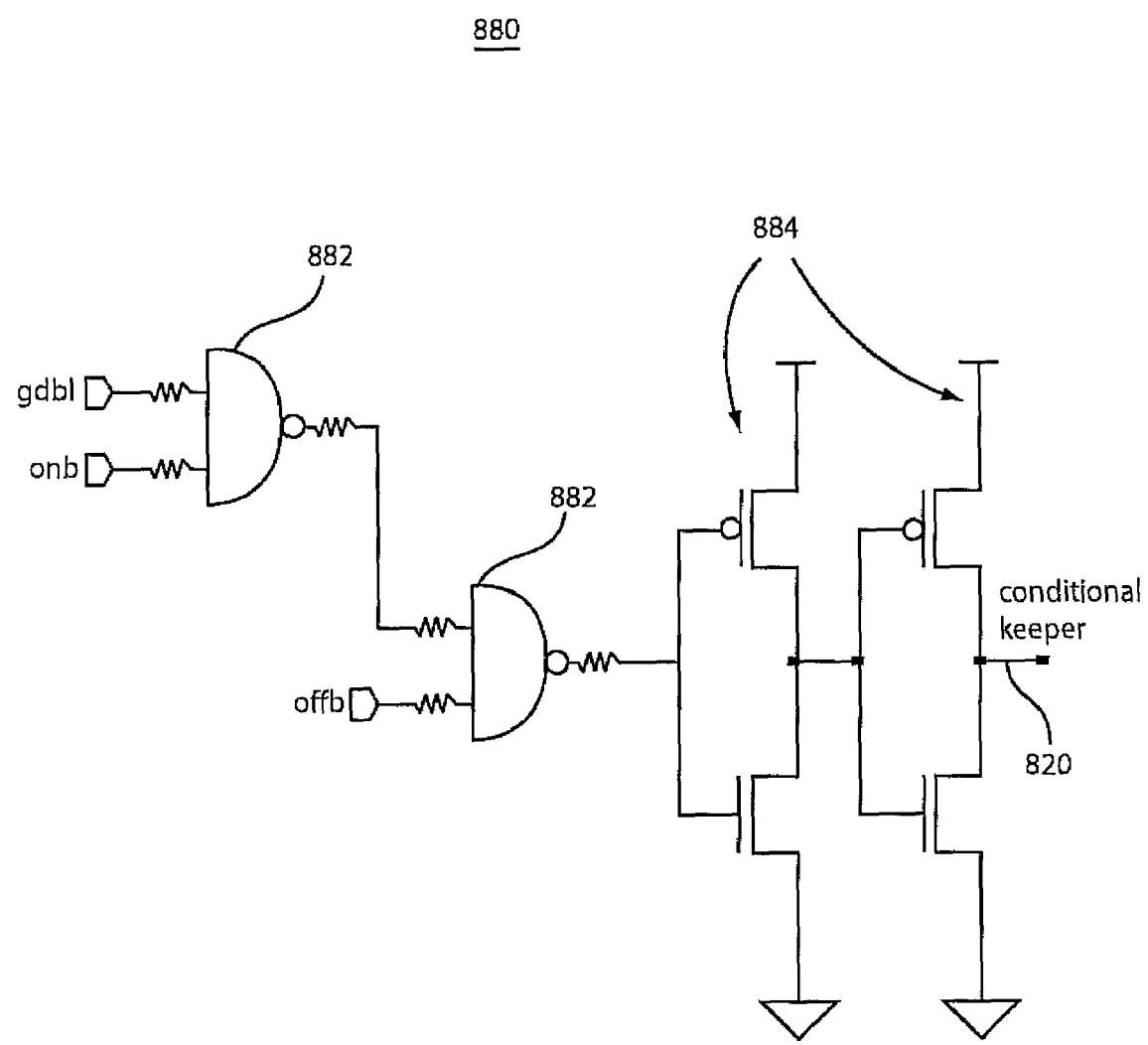
FIG. 10A is schematic diagram showing a conditional keeper signal generation circuit in accordance with an illustrative embodiment.

Referring to FIG. 10A, memory cells on local read bitlines (Lrbl) have read port devices 808 too weak to fight an active keeper. Conditional keeper 820 is provided. Conditional keeper 820 is generated in accordance with a control circuit 880. Control circuit 880 uses a global dummy bitline (gdbl) as a keeper control to delay turn-on of the circuit for the delayed-on condition. Other controls include always on (using onb), always off (using offb). The global dummy bitline (gdbl) goes low every read cycle to mimic a read of a "zero". If both onb and offb are high, when signal gdbl goes "low", gdbl will propagate through NAND gates 882 and inverters 884 to a PFET keeper circuit 852 as the conditional keeper signal 820. Other gates and components may be employed to provide the conditional keeper signal 820.

The delay in generating the conditional keeper signal 820 signal will cause the keeper transistors of circuit 852 to turn on only after a memory cell has had time to pull the local bitline (Lrbl) "low".

Referring again to FIG. 10 with continued reference to FIG. 10A, if the NAND gate 854 output is high for the local evaluation circuit 226 (FIG. 10), as a result of a local bit line input being low, the PFET keeper circuit 852 will be prevented from turning on. If offb signal is low the keepers 852 stay turned off. If onb signal is low then the keepers 852 will be forced to be always on. Since the NAND gate 854 has its inputs connected to the local bitlines (e.g., Lrbl_bot, etc.), the local bitlines can be evaluated to determine there state and to ensure that their state is not floating.

Local bitlines are NANDED together (NAND 854) and the output is fed to an NFET device 855. The drain output of this device is to global bitlines (grbl) which are dotted "OR"ed as generated from several local evaluation 226 circuits. The dynamic global bitlines (grbl) are precharged high and held high by a half latch formed by NAND gate 854 and keeper circuit 852 and a feedback path therebetween.

Global evaluation circuit 228 provides gating of data for output (sat) to output stage 230 in accordance with a bit address (bit addr). The output stage 230 employs a selector signal to select the appropriate output latch. Global reset and reset out (rsout) are provided. During a read operation data in the cell 810 is read onto the Lrbl_bot and into the local evaluation circuit NAND gate 854 as described above.

Both local read bitlines, Lrbl, and global read bitlines, grbl, are precharged high. With a "0" in the cell 810 both read port devices 808 will be on when the read wordline rwl activates, discharging the Lrbl_bot to "0". This will cause NAND gate 854 output to go "high" turning on the NFET 855 connected to the global read bitline, grbl, and pulls grbl "low". If Bit addr, the column select input to the global evaluation circuit 228, is "high", the global read bitline, grbl, will be evaluated. With grbl "low" into the global evaluation circuit 228, the evaluation will result in node "sat" being pulled "low".

For the case of a "1" in the cell 810, both local and global Read bitlines (Lrbl and grbl) will remain in their precharged "high" state keeping node "sat" also at a "high".

In order to achieve low leakage and active power, all the gates/bitlines are comprised of high Vt devices in FIG. 10. Individual unused blocks/banks can be shut off by shutting off segments as well as disabling blocks to reduce power. In one embodiment, read and write word lines are connected to metal 3 (layer three metal in the chip design) and bit lines are connected to metal 1 (layer one metal in the chip design). A read word line (rwl) connects to all 72 cells in a row.

A fabricated chip (in 65 nm PD SOI) was produced in accordance with the present principles. Peripheral logic and each SRAM segment were fully functional to MARCH and other complex ABIST patterns. An on-chip array clock was fully characterized over a wide range of voltages (e.g., 0.4 V to 1.5 V) and temperatures (e.g., −25° C. to 100° C.). The design supports two power supplies, a logic supply and a SRAM power supply to better characterize cell performance and any variabilities (L, W, Vt) which degrade the performance.

Use of high Vt read port cell devices results in a modest reduction in stand-by leakage compared to regular Vt without sacrificing access time at nominal Vdd. The leakage reduction is limited by the high Vt precharge devices used in the bitline. A new half select disturb-free SRAM design is disclosed with high speed, high yield and low Vmin.

Figure 12:
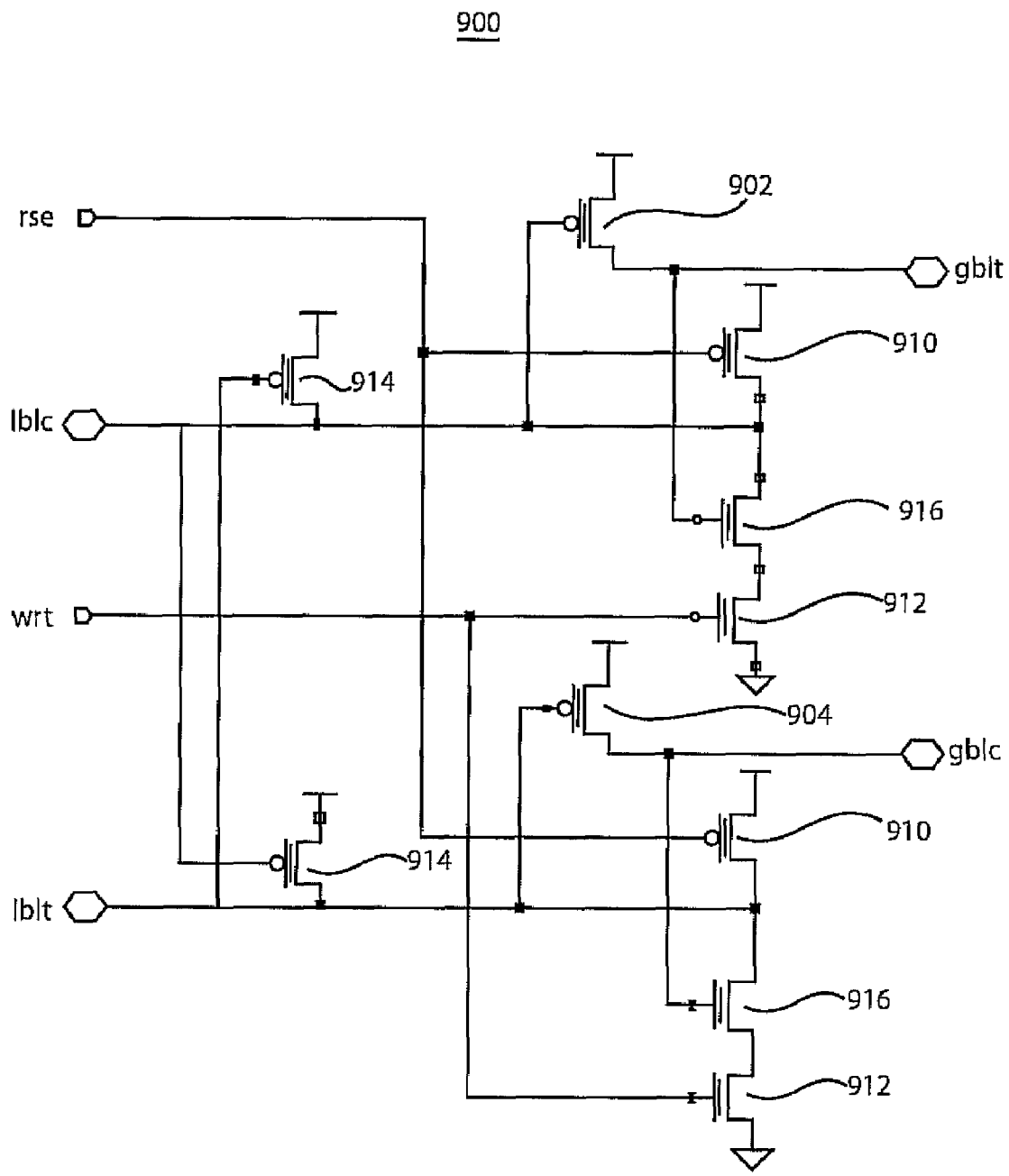
FIG. 12 is a schematic diagram showing a local evaluation circuit for a 6T cell design in accordance with an illustrative embodiment.

Referring to FIG. 12, a local evaluation (or bit select) circuit 900 is illustratively depicted in accordance with an illustrative embodiment. Circuit 900 may be employed in a 6T cell design although the principles described herein may be applied to other designs and technologies. In a 6T design, there are 16 cells on a bitline, and the bitlines (lblc and lblt) are shared for both read and write operations.

An appropriate output of any one bitline (e.g., lblc and lblt) drives PFETs 902 and 904. PFETs 902 and 904 may have higher mobility due to additional strains added thereto during fabrication. Advantageously, as opposed to prior art designs, the memory cell being read (through bitlines) does not have to drive an NFET of an inverter, which would reduce the capacitance on the cell. For example, a "0" output from a cell would have to be inverted to be amplified. Since it is difficult to amplify a "0", by employing PFETs 902 and 904, a "0" results in gblt and gblc being precharged "high" when the cell includes a "0". No inverter is needed, which results in less capacitance on the memory cells. Global bitlines may be shared for both read and write operations.

The output of various local evaluation circuits (e.g., 8 or 16, etc.) are driven by the PFETs 902 and 904 and have dotted "OR" on a single global bitline (gblt, gblc). In the present example, the reading and writing are shared by the same global bitline. When the write enable signal "wrt" is "on" the data is transferred on the global line (gblt, gblc) through the local bitline (lblc, lblt) and then into a cell.

Bitlines lblc and lblt have PFET transistors 914 with gates cross-coupled for noise reduction. NFETS 912 are employed for enabling the write operation with wrt. NFETs 916 are gated by the global bitlines. PFETs 910 are responsive to a reset rse signal to reset the bitlines.

In the local evaluation circuit 900, cell output drive PFET devices 902 and 904 may be connected to "VCS" or "Vdd" as a supply voltage. By connecting to VCS the delays through PFETs 902 and 904 can be reduced significantly and performance can be improved. The other transistors may or may use a supply voltage of Vdd while the PFETs 902 and 904 employ VCS. VCS is greater than Vdd. In addition, the transistors of circuit 900 may employ a high threshold voltage (Vt) or a standard threshold voltage (Vt).

Figure 13:
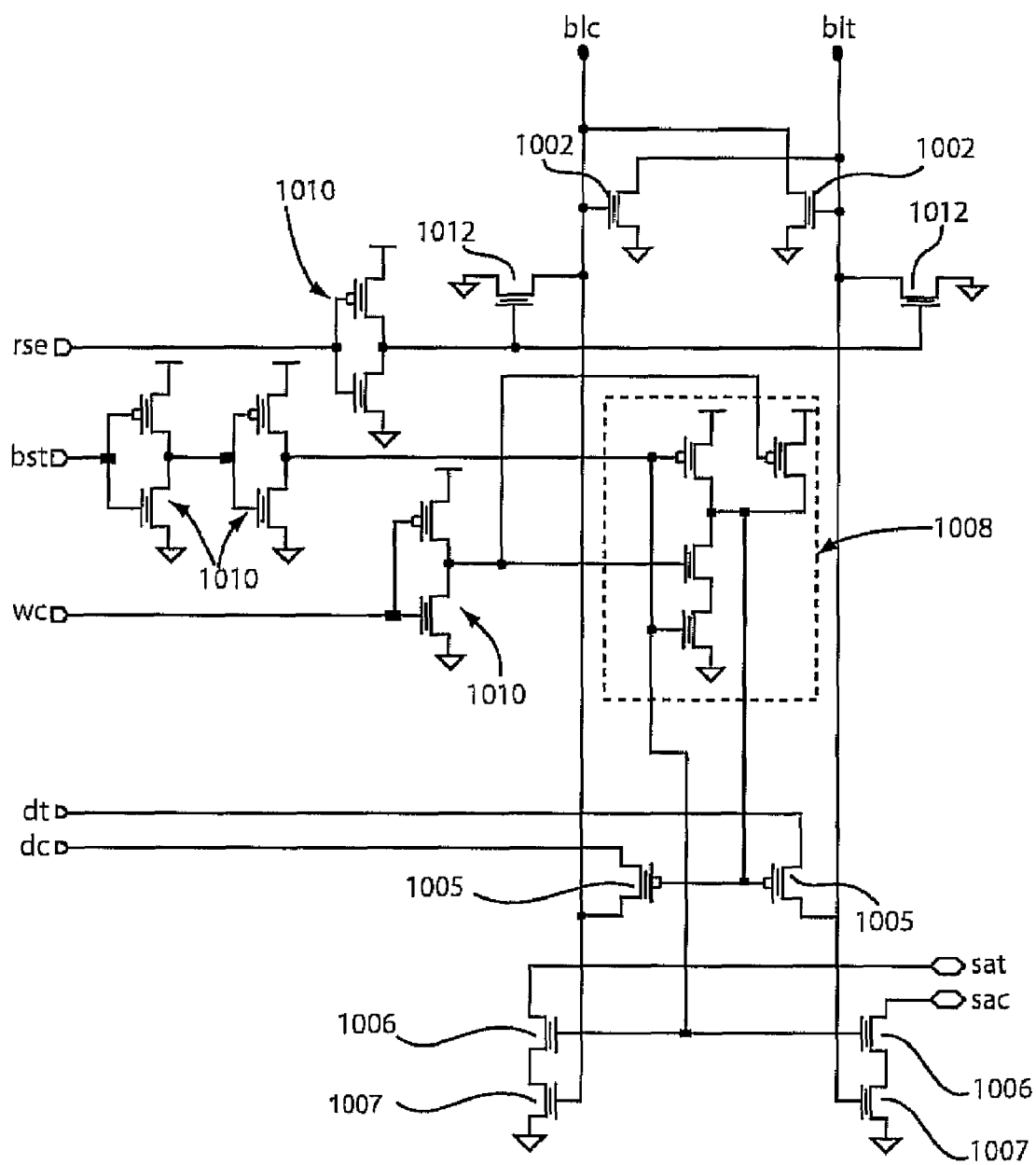
FIG. 13 is a schematic diagram showing a global evaluation circuit of FIG. 10 in greater detail in accordance with an illustrative embodiment.

Referring to FIG. 13, a global evaluation circuit 228 is shown in greater detail. Circuit 228 includes dc and dt inputs, which are complementary data and true data, respectively. dc and dt are connected to bitlines blc and blt in accordance with transistors 1005. Transistors 1005 are controlled by circuit 1008. Other control signals include a write control wc, a bit select or column select signal bst, and a global reset signal rse. Rse employs transistors 1012 to reset bitlines blc and blt.

Global evaluation circuit 228 predischarges the (global) bitlines blc and blt using global reset rse and transistors 1012. Rse can be derived from a wordline clock pulse or independently controlled by a separate clock block (e.g., clock generator 208 (FIG. 2)). Wc and bst control signals are "NOR"ed by a write control circuit 1008 to select the column for writing and reading (e.g., when write control wc is "off").

When the write operation wc turns on, global reset rse is turned off which controls predischarge NFETs 1012. Then, writing or reading is possible. Cross-coupled NFETS 1002 are provided for noise immunity. Write control circuit gates 1008 are employed with the bst signal such that if the column is selected then reading or writing can be accordingly performed.

Transistors 1006 and 1007 are controlled by bst. The output of the global read signal is gated by the bst signal using stacked NFET devices 1006 and 1007. In one embodiment, device 1007 may include a regular Vt and device 1006 can be a high Vt. The output of evaluation circuit 228 includes a sat/sac signal. Inverters 1010 are employed for rse, bst and wc inputs. The global rse signal can be independently controlled to allow high frequency operation, if needed.

Having described preferred embodiments of a programmable pulsewidth and delay generating circuit for integrated circuits (which are intended to be illustrative and not limiting), it is noted that modifications and variations can be made by persons skilled in the art in light of the above teachings. It is therefore to be understood that changes may be made in the particular embodiments disclosed which are within the scope and spirit of the invention as outlined by the appended claims. Having thus described aspects of the invention, with the details and particularity required by the patent laws, what is claimed and desired protected by Letters Patent is set forth in the appended claims.

What is claimed is:

1. A local on-chip programmable pulsewidth and delay generating circuit, comprising:
   a clock generation circuit configured to receive a global clock signal and output a local clock signal, the clock generation circuit including a pulse shaping portion which adjusts a pulse width of the global clock signal in accordance with at least one of a trailing edge delay and a leading edge delay;
   the leading edge delay being generated by a leading edge delay circuit;
   the trailing edge delay being generated by a trailing edge delay circuit configured to apply a delay to a trailing edge of a pulse;
   the trailing edge delay circuit including a delay chain having programmable stages of delay elements, each stage being independently controlled using control bits decoded from address latches.

2. The circuit as recited in claim 1, wherein the delay chain includes NAND gates configured to introduce delay elements in accordance with the control bits.

3. The circuit as recited in claim 1, wherein the control bits are output from a wordline address scan using word line decode latches.

4. The circuit as recited in claim 1, wherein the leading edge delay circuit provides a plurality of programmable delay settings for delaying the pulse.

5. The circuit as recited in claim 1, wherein the trailing edge delay circuit includes a fine control delay element which provides a plurality of programmable delay settings.

6. The circuit as recited in claim 1, further comprising a no chop circuit configured to restore an original pulsewidth in accordance with a control bit.

7. The circuit as recited in claim 1, further comprising an address encoder configured to activate the local clock in accordance with address input signals.

8. The circuit as recited in claim 1, wherein the local clock generates wordline pulses.

9. The circuit as recited in claim 1, wherein the wordline pulses include the local clock signal plus a delay to improve read/write margin.

10. The circuit as recited in claim 1, wherein the generating circuit is included in one or more individual clock blocks where the clock blocks include at least one of a word clock block, a bit clock block, a read/write clock block, wordline generation, and global reset generation.

11. The circuit as recited in claim 1, further comprising an on-chip stress circuit configured to stress memory cells by incrementally adjusting word line pulse width in accordance with the on-chip programmable pulsewidth and delay generating circuit.

12. A method for local on-chip programmable pulsewidth and delay generation, comprising:
   outputting a local clock signal from a global clock signal by pulse shaping a pulse of the global clock signal in accordance with at least one of a trailing edge delay and a leading edge delay, wherein shaping the pulse includes:
   generating the leading edge delay includes providing a plurality of programmable delay settings for delaying the pulse; and generating a trailing edge delay includes delaying the trailing edge using a delay chain having programmable stages of delay elements, each stage being independently controlled using control bits decoded from address latches.

13. The method as recited in claim 12, wherein the delay chain includes NAND gates configured to introduce delay elements in accordance with the control bits and further comprising controlling an amount of delay in accordance with control bits output from a wordline address scan using word line decode latches.

14. The method as recited in claim 12, wherein generating the trailing edge delay includes employing a fine control delay element which provides a plurality of programmable delay settings.

15. The method as recited in claim 12, further comprising restoring an original pulsewidth by employing a no chop circuit activated in accordance with a control bit.

16. The method as recited in claim 12, further comprising generating wordline pulses from the local clock signal.

17. The method as recited in claim 12, further comprising stressing memory cells by incrementally adjusting word line pulse width in accordance with the on-chip programmable pulsewidth and delay generation.

* * * * *